US008938573B2

(12) United States Patent
Greenfield et al.

(10) Patent No.: US 8,938,573 B2
(45) Date of Patent: Jan. 20, 2015

(54) ROW HAMMER CONDITION MONITORING

(75) Inventors: Zvika Greenfield, Kfar Sava, IL (US); Kuljit S. Bains, Olympia, WA (US); Theodore Z. Schoenborn, Portland, OR (US); Christopher P. Mozak, Portland, OR (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 13/539,417

(22) Filed: Jun. 30, 2012

(65) Prior Publication Data

US 2014/0006704 A1    Jan. 2, 2014

(51) Int. Cl.
*G06F 12/06* (2006.01)
*G11C 11/406* (2006.01)
*G06F 11/30* (2006.01)

(52) U.S. Cl.
CPC ...... *G06F 11/3037* (2013.01); *G11C 11/40622* (2013.01); *G11C 11/40618* (2013.01); *G11C 11/40611* (2013.01)
USPC ............ 711/101; 711/103; 711/106; 711/203

(58) Field of Classification Search
CPC ................ G06F 2212/2022; G06F 2212/7211; G06F 12/109
USPC .................................. 711/101, 103, 106, 203
See application file for complete search history.

(56) References Cited

U.S. PATENT DOCUMENTS

| 5,193,072 | A | 3/1993 | Frenkil et al. |
|---|---|---|---|
| 2003/0037185 | A1 | 2/2003 | Davis et al. |
| 2006/0069855 | A1 | 3/2006 | Ha et al. |
| 2007/0083790 | A1 | 4/2007 | Nurmi et al. |
| 2007/0183232 | A1 | 8/2007 | Okada |
| 2008/0074934 | A1 | 3/2008 | Doyle et al. |
| 2008/0140925 | A1 | 6/2008 | Lee et al. |
| 2008/0151669 | A1* | 6/2008 | Bill et al. ...................... 365/222 |
| 2009/0161467 | A1 | 6/2009 | Lin et al. |
| 2009/0217281 | A1* | 8/2009 | Borkenhagen ................ 718/104 |
| 2010/0034024 | A1 | 2/2010 | Mochizuki et al. |
| 2010/0106828 | A1 | 4/2010 | Palanki et al. |
| 2010/0110810 | A1 | 5/2010 | Kobayashi |
| 2010/0142304 | A1 | 6/2010 | Pyeon |
| 2010/0188914 | A1 | 7/2010 | Ahn et al. |
| 2010/0208537 | A1 | 8/2010 | Pelley et al. |
| 2011/0026353 | A1 | 2/2011 | Mokhlesi |

(Continued)

OTHER PUBLICATIONS

International Search Report and Written Opinion of the International Searching Authority dated Oct. 18, 2013, in International Patent Application No. PCT/US2013/048016, 9 pages.

International Search Report dated Oct. 18, 2013, in International Patent Application No. PCT/US2013/048634, 3 pages.

(Continued)

*Primary Examiner* — Jae Yu (74) *Attorney, Agent, or Firm* — Blakely, Sokoloff, Taylor & Zafman LLP (57) ABSTRACT

A system monitors data accesses to specific rows of memory to determine if a row hammer condition exists. The system can monitor accessed rows of memory to determine if the number of accesses to any of the rows exceeds a threshold associated with risk of data corruption on a row of memory physically adjacent to the row with high access. Based on the monitoring, a memory controller can determine if the number of accesses to a row exceeds the threshold, and indicate address information for the row whose access count reaches the threshold.

14 Claims, 5 Drawing Sheets

(56) References Cited

U.S. PATENT DOCUMENTS

| | | |
|---|---|---|
| 2011/0211385 A1* | 9/2011 | Shinozaki ................... 365/154 |
| 2011/0238941 A1 | 9/2011 | Xu et al. |
| 2012/0054582 A1 | 3/2012 | Byom et al. |
| 2014/0006703 A1 | 1/2014 | Bains et al. |
| 2014/0156923 A1 | 6/2014 | Bains et al. |

OTHER PUBLICATIONS

International Search Report and Written Opinion of the International Searching Authority dated Oct. 7, 2013, in International Patent Application No. PCT/US2013/045793, 9 pages.

Office Action mailed Jul. 29, 2014, in U.S. Appl. No. 13/539,415, 9 pages.

\* cited by examiner

ROW HAMMER CONDITION MONITORING

FIELD

Embodiments of the invention are generally related to memory management, and more particularly to monitoring for a row hammer event.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With the latest generation of increased density, intermittent failure has appeared in some devices. For example, some existing DDR3 based systems experience intermittent failures with heavy workloads. Researchers have traced the failures to repeated access to a single row of memory within the refresh window of the memory cell. For example, for a 32 nm process, if a row is accessed 550K times or more in the 64 millisecond refresh window, the physically adjacent wordline to the accessed row has a very high probability of experiencing data corruption. The row hammering or repeated access to a single row can cause migration across the passgate. The leakage and parasitic currents caused by the repeated access to one row cause data corruption in a non-accessed physically adjacent row. The failure issue has been labeled as a 'row hammer' or '1 row disturb' issue by the DRAM industry where it is most frequently seen.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system monitors data accesses to specific rows of memory to determine if a row hammer condition exists. The monitoring can be broken down into tracking the count for the most active rows, and not necessarily tracking every single row of memory in the system. The system can monitor accessed rows of memory to determine if the number of accesses to any of the rows exceeds a threshold associated with risk of data corruption on a row of memory physically adjacent to the row with high access. The threshold is the row hammer condition threshold. Based on the monitoring, a memory controller can determine if the number of accesses to a row exceeds the threshold, and indicate address information for the row whose access count reaches the threshold.

A specific row of a memory device can be the target of repeated accesses. When the row is accessed repeatedly within a time threshold (also referred to as "hammered" or a "row hammer event"), a physically adjacent row or rows (a "victim" row) may experience data corruption. To address the row hammer event with a runtime operation, the memory controller can monitor the number of activations of each row in the memory subsystem within a time window to determine when a row hammer event occurs. In one embodiment, the memory controller triggers a targeted refresh on a physically adjacent row or rows to the row determined to be hammered.

However, it will be understood that current computing systems can use up to 8 GB of memory, with projections of up to 64 GB of memory in consumer client devices in the near future, and with server devices including much larger amounts of memory. Thus, to monitor every row of memory, the memory controller could be required to monitor, for example, at least up to 1-8 million counters, requiring between 3-32 MB of counters memory on die. Thus, the straightforward monitoring solution (monitoring each row separately), is prohibitive in terms of the cost.

As described herein, in one embodiment, a system monitors only a subset of the memory accesses. For example, the system can be configured to monitor the most heavily accessed rows. More details with respect to approaches to monitor only a subset of memory rows are found below. In general, a memory controller monitors accesses for a defined time period, and determines if the number of access exceeds a threshold number for any of the rows of memory being monitored. If accesses to any row exceed the threshold, the memory controller can then indicate the address information for that row. The tracking or monitoring of a subset of rows can be accomplished, for example, by use of a table with entries for the most accessed TOWS.

The theoretical maximum number of times a row can be accessed within a 64 ms window (e.g., a refresh window) is 1.35 million times (64 ms refresh window divided by 47 ns access time) for current DRAMs (dynamic random access memory). The practical maximum without risking data corruption in the victim rows is much lower, and depends on the process technology used. However, by detecting a row hammer event, the system can reduce the risk of data corruption to a victim row or rows of memory.

The examples provided herein primarily discuss the row hammer monitoring with respect to DRAM. However, it will be understood that the row hammer issue is more generally a memory device scaling issue, which occurs as memory densities increase. Thus, the descriptions with respect to DRAM will be understood as non-limiting examples that can be applied to other memory technologies that include memory controller or equivalent logic. Row hammer monitoring described herein is compatible with any of a number of memory technologies, such as DDR4 (dual data rate version 4, specification in development as of the filing of this application), LPDDR4 (low power dual data rate version 4, specification in development as of the filing of this application), or WIDEIO (specification in development as of the filing of this application).

In a memory device, rows that are physically adjacent can often be logically labeled or mapped differently from one manufacturer to another. Typically a manufacturer maps logically adjacent rows of memory by a physical address offset, and the offsets can be different among different manufacturers. The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows are physically adjacent.

In a typical refresh scenario, the memory device itself tracks what needs to be refreshed when. The memory device refreshes the victim row(s) by opening the row and then closing the row(s) to refresh. In one embodiment, the memory controller triggers the memory device to perform a targeted refresh on a specific victim row or rows, or a region or regions in which victim row(s) are found. Thus, the victim row(s) can be refreshed, which reduces the likelihood of data corruption due to row hammering.

It will be understood that even though the system can perform a targeted refresh on a region granularity, row hammer monitoring is most effective when monitoring is done at row-level granularity. Assuming monitoring could be accomplished in an area instead of for a specific row, the monitoring of a region can result in large areas being somewhat inefficiently monitored, and refreshed more frequently than would be needed if the specific hammered row is identified.

It will be understood that for the memory controller to indicate an address of the hammered row to cause the memory device to refresh victim row(s) of the hammered row requires a certain number of bits to identify a specific address. In one embodiment, the memory controller identifies a specific address of the hammered row. Based on that specific address, the memory controller can identify the specific address to a memory device to cause it to do a very specific refresh of a victim row. In another embodiment, the memory controller identifies an area larger than a specific row. Thus, a memory controller can identify a specific block, a specific row, or an area, depending on the chosen configuration.

Figure 1:
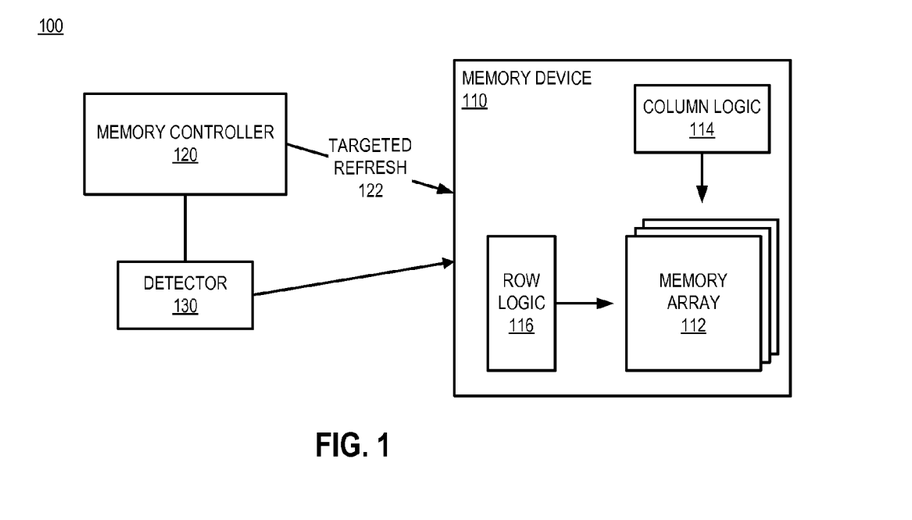
FIG. 1 is a block diagram of an embodiment of a system that monitors for a row hammer condition.

FIG. 1 is a block diagram of an embodiment of a system that monitors for a row hammer condition. System 100 includes memory device 110 coupled to memory controller 120. Memory device 110 can include any type of memory technology that has adjacent rows of memory cells, where data is accessible via a wordline or the equivalent. In one embodiment, memory device 110 includes dynamic random access memory (DRAM) technology.

Memory device 110 includes memory array 112, which represents one or more logical and/or physical groups of memory. An example of a grouping of memory is a bank of memory. While not specifically shown in system 100, memory array 112 can include one or more rows that are the targets of repeated access within a time window. Such a row is subject to a row hammer condition. In many modern memory devices, the architecture of the semiconductor layout causes one or more physically adjacent rows to be at risk of becoming corrupted. The row or rows at risk of becoming corrupted due to row hammer condition are referred to herein as victim rows.

Memory device 110 includes column logic 114 and row logic 116, which are used to decode an access instruction to the proper memory location within memory array(s) 112. There is no requirement for the number of rows and columns to be equal, and in fact they are typically not equal. Memory controller 120 sends commands or instructions to memory device 110 over a command bus (e.g., a command/address (C/A) bus), which are then interpreted by memory device 110. Memory device 110 decodes the command information to perform a variety of access functions within the memory, and decodes address information via column logic 114 and row logic 116. The logic accesses a specific location in memory with a combination of a column address strobe or signal (CAS) and a row address strobe or signal (RAS). Rows of memory can be implemented in accordance with known memory architectures or their derivatives. Briefly, a row of memory includes one or more addressable columns of memory cells, as identified by the CAS generated by column logic 114. The rows are addressable via the RAS generated by row logic 116.

System 100 includes detector 130, which represents hardware and/or software or other logic that enables system 100 to detect a row hammer event or row hammer condition. There can be multiple different mechanisms used to detect the row hammer condition. As specifically described herein, system 100 detects a row hammer condition via detector 130, which includes a table or log to monitor accesses to selected rows of memory. Thus, detector 130 can determine when a row of memory array 112 experiences repeated accesses within a threshold time period. Detector 130 can include hardware and/or logic at memory device 110, memory controller 120, and/or separate from either the memory device or the memory controller.

Detector 130 determines a number of times a row is access within a time period. A row hammer event is not simply about how many times a row is accessed, but how many times in a given time period. Once a row is refreshed, the conditions that could cause data corruption are overcome. Thus, the time period for the monitoring can be based at least in part on the refresh rate. In one embodiment, the time period during for which detector 130 monitors for a threshold number of accesses is equal to the refresh cycle time of memory device 110.

In one embodiment, memory controller 120 generates targeted refresh command 122 to cause the memory controller to perform a targeted refresh in response to detecting a row hammer event. Targeted refresh command 122 is a refresh command that occurs "off-schedule," meaning that the command is sent in response to detecting the row hammer event as opposed to sending command because a timer indicates it is time to perform a refresh. In one embodiment, memory controller 120 doubles up an existing command to send a targeted refresh command, such as examples described in co-pending patent application Ser. No. 13/539,415, entitled, "Row Hammer Refresh Command," filed concurrently herewith. For example, targeted refresh command 122 could be doubled up with either an Activate or a Refresh command as defined for DRAM (dynamic random access memory). The memory controller can accomplish the doubling up, for example, by use of another pin and/or a Mode Register state that can cause the memory device to interpret a command as a targeted refresh instead of the Activate or (standard) Refresh commands. Memory controller 120 provides address information to indicate the hammered row. Detector 130 can indicate address information identifying the row, which memory controller 120 can indicate to memory device 110 to cause the memory device to determine what victim row(s) should be refreshed. The address can be indicated to the memory device specifically, or can be provided more generally. Thus, when detector 130 determines that a specific row of memory is subject to a row hammer condition (accesses have reached or exceeded a threshold), it indicates the row to memory controller 120, which in turn can send a targeted refresh command.

When referring to targeted refresh command 122, it will be understood that different memory device manufacturers use different logic and architectures to utilize the memory resources of the devices. For example, different memory device manufacturers can use different offsets to map between logical memory addresses used in the host processor (not shown) and the physical memory addresses used internally to memory device 110. In one embodiment, memory controller 120 utilizes the same logical memory addresses as used by the host processor. Thus, in one embodiment, memory controller 120 provides a row address to memory device 110 indicating the hammered row. The memory controller can indicate the row address in conjunction with and/or as part of a command that it issues to memory device 110. The memory device can then compute the specific address or addresses of any victim row(s). Memory device 110 then performs a targeted refresh on the physically adjacent, victim row(s).

As described in more detail below, detector 130 includes configuration to set the timeframe for which it is to monitor for a row hammer condition, as well as configuration to set the number of accesses that define a row hammer event that would cause the memory controller to trigger a targeted refresh. Detector 130 maintains data for a subset of the total number of rows in system 100. In one embodiment, detector 130 maintains data for a number of rows based on MVC, which is the maximum victim count expected for the configured timeframe. For example, detector 130 can keep a table with MVC+1 entries, or more entries. Detector 130 can then roll entries into the table for memory locations that are accessed, rolling out the lowest-count entries in the table to replace them. More details of a specific implementation are described below with respect to FIG. 4.

Figure 2:
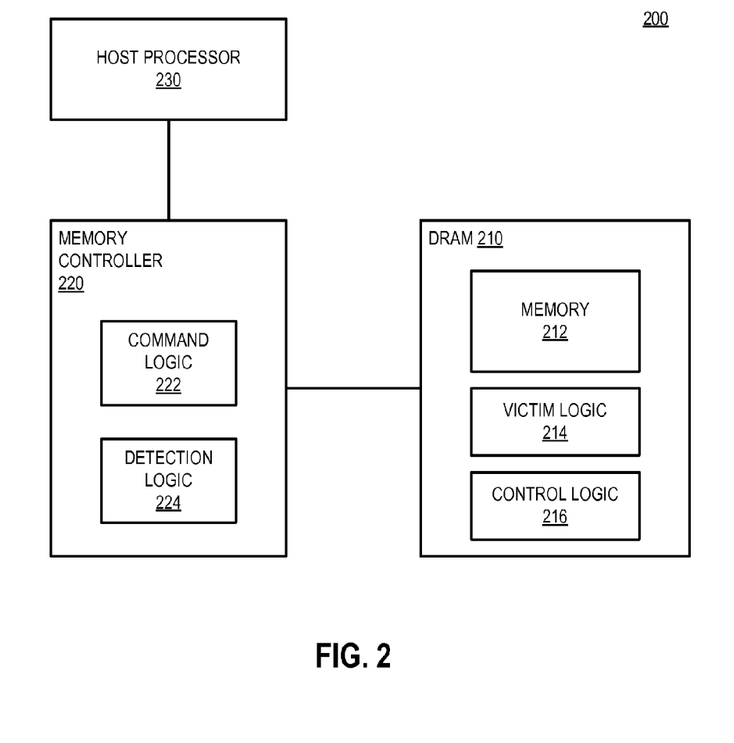
FIG. 2 is a block diagram of an embodiment of a system that monitors for a row hammer condition based on memory controller access commands.

FIG. 2 is a block diagram of an embodiment of a system that monitors for a row hammer condition based on memory controller access commands. System 200 is a system that includes a memory device coupled to host processor 230 via memory controller 220, and can be one example of a system in accordance with system 100 of FIG. 1. System 200 includes memory device DRAM 210 coupled to memory controller 220. Memory controller 220 is coupled in turn to host processor 230.

Host processor 230 can be any type of processing unit, processor, or microcontroller. Host processor 230 performs the primary execution of operations in system 200. Operations executed by host processor 230 typically originate from instructions and data stored in DRAM 210. DRAM 210 is a memory device in accordance with any embodiment described herein. DRAM 210 includes memory cells 212, which store the data and instructions used by host processor 230. In one embodiment, DRAM 210 is a volatile memory, or a memory device whose contents are non-deterministic if power is interrupted to the device. Thus, a volatile memory requires a regular power source to allow it to refresh the memory cells to keep the data from become lost or corrupted.

DRAM 210 includes hardware connectors that interface with corresponding hardware connectors of memory controller 220. Memory access from host processor 230 typically goes through memory controller 220. In one embodiment, memory controller 220 is part of host processor 230. In an alternate embodiment, memory controller is part of a supporting "chipset" or hardware logic that provides an infrastructure for power and interface logic for a hardware platform of which host processor 230 is a part.

As mentioned above, a detector enables memory controller 220 to identify a row hammer condition to be able to respond to the row hammer condition with a targeted refresh command. Detection logic 224 is illustrated as being part of memory controller 220, and represents some or all of the logic needed to detect row hammering in system 200. Memory controller 220 includes command logic 222, which represents hardware and software or other logic to enable memory controller 220 to perform its functions of managing memory access to DRAM 210.

DRAM 210 includes victim logic 214, which represents logic to determine what row or rows are at risk of corruption due to the row hammer condition. In one embodiment, victim logic 214 can be at least partially executed at memory controller 220. However, for the sake of broader interoperability between memory controller 220 and other types of memory devices, victim logic 214 generally resides at DRAM 210. Thus, memory controller 220 need only identify the fact that a row hammer condition exists, and then send a command specifying the address or address range of the target row. DRAM 210 can then use a map or other logic to determine what row or rows are potential victims.

DRAM 210 includes control logic 216, which includes logic to perform refresh of memory 212. Each memory device includes some logic to keep track of what memory cells have been refreshed, and what rows are next due for a refresh. Control logic 216 can implement the actual targeted refresh based on receiving a targeted refresh command from memory controller 220.

Figure 3:
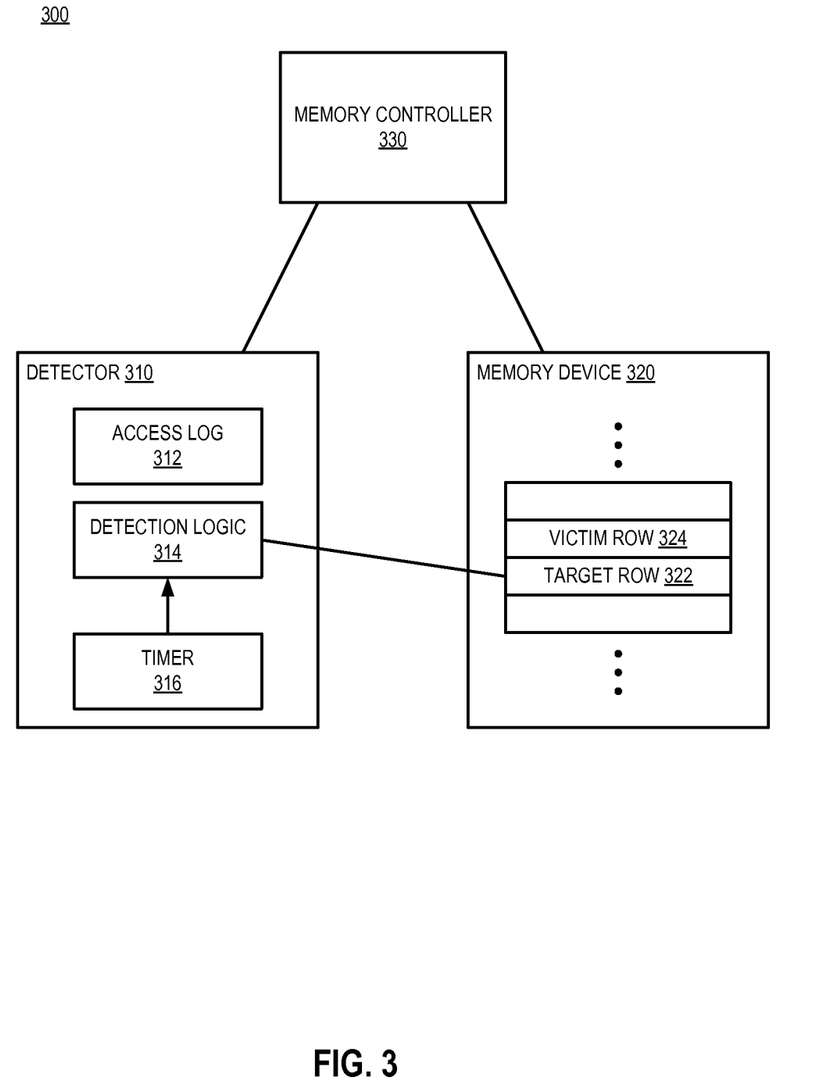
FIG. 3 is a block diagram of an embodiment of a system that uses an access log to monitor for a row hammer condition.

FIG. 3 is a block diagram of an embodiment of a system that uses an access log to monitor for a row hammer condition. System 300 represents an example of a system that includes a memory subsystem with memory controller 330, memory device 320, and detector 310. System 300 provides one example of a system in accordance with system 100 of FIG. 1 or system 200 of FIG. 2. In one embodiment, detector 310 is part of memory controller 330. Memory controller 330 can issue a targeted refresh command in response to detection of a row hammer condition by detector 310.

Memory device 320 includes multiple rows of memory. Among the rows is target row 322, which is a row that is the target of repeated access within a time period. Victim row 324 is a row that is at risk of data corruption due to the hammering of target row 322. There can be more than one victim row associated with a hammered row (e.g., each row physically adjacent to the hammered row).

In one embodiment, detector 310 include access log 312. Access log 312 can be implemented as a list or array or table or other logical structure that stores entries having multiple fields of information. Each entry includes at least an address or identifier for a specific row of memory and an access count for the entry. The number of entries in access log 312 is much smaller than the total number of rows in memory device 320. Thus, detector 310 monitors keeps a count for a subset of all rows. The count of each row can be incremented as the row is accessed again, and the count can be compared to the threshold to determine if the row has been accessed the threshold number of times.

Detection logic 314 includes logic to enable detector 310 to determine that an access command is directed to a row of memory. While detection logic 314 is shown specifically with a line to target row 322, detection logic 314 can monitor accesses to any row. In one embodiment, detection logic 314 includes a mechanism to determine an address of an Activate command issued by memory controller 330. Thus, every time memory controller 330 sends a command for memory device 320 to activate a row of memory, detector 310 can identify the address associated with the command, and keep track of access for the address in access log 312.

Detector 310 determines when access to a row exceeds a threshold, and indicates the row address information to the memory controller. It will be understood that the address information in access log 312 is not necessarily the same address used by memory device 320 to access the physical memory resources. Memory device 320 decodes the addresses sent by memory controller 330 to physical resources. Thus, when detector 310 identifies a row for which accesses have reach or exceeded the threshold, the information may still need to be decoded to identify physical resources of target row 322 so that physically adjacent victim row 324 can be identified.

Detector 310 receives timer information 316, through which detector 310 can identify the start of a timeframe, as well as the end of a timeframe. The monitoring takes place between the timeframe. In one embodiment, the timeframe goes from one scheduled refresh to the next.

In one embodiment, detector 310 clears the count of an entry in access log 312 when the entry reaches the threshold and is identified to the memory controller. It will be understood that detection can be performed on a rank and/or bank granularity. There is not necessarily a single detector 310 for the memory controller. Each bank can be tracked, and each memory channel can have monitoring.

Figure 4:
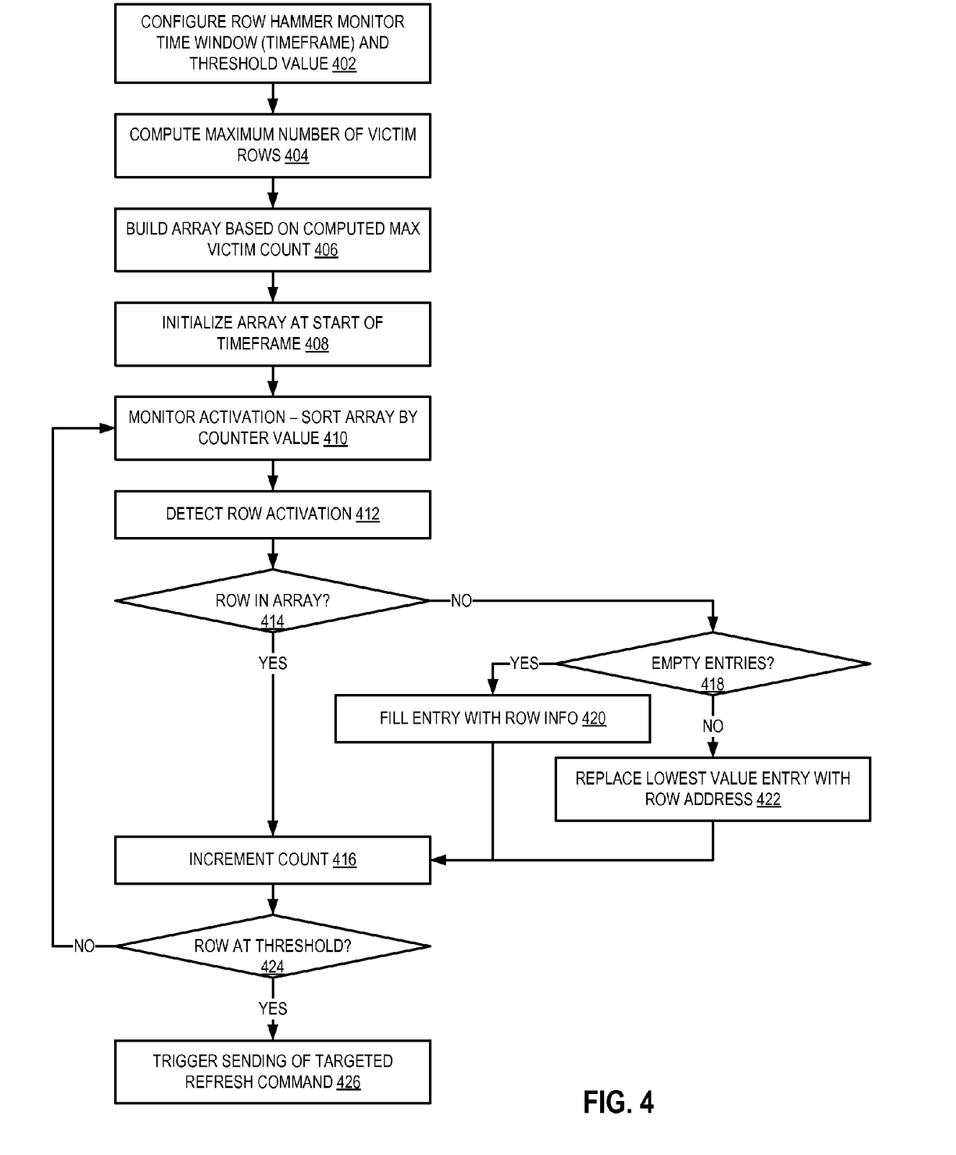
FIG. 4 is a flow diagram of an embodiment of a process for monitoring a row hammer condition of a memory device.

FIG. 4 is a flow diagram of an embodiment of a process for monitoring a row hammer condition of a memory device. An administrator can configure a memory subsystem with a row hammer monitor time window or timeframe, and a threshold value of accesses that indicates a row hammer condition, 402. The administrator can pre-configure the system to receive inputs that indicate the timeframe and threshold values. In one embodiment, the configuring is part of setting register values or configuration in firmware for the memory subsystem. The system includes a detector or detection logic configured to perform monitoring for the timeframe, monitoring for the threshold number of accesses.

Thus, the timeframe and number of accesses are defined in the system. In one embodiment, the timeframe is 64 milliseconds. The number of accesses that make up the threshold depend on the architecture of the memory device to which the memory controller is connected, including the size of the memory and the density of the memory (e.g., the minimum process feature size). The number of accesses that indicate a row hammer event can be somewhere in the range of 150K to 550K accesses during the time window.

The memory controller or detector can compute the maximum number of victim rows that are possible in the system, 404. The operations described below could be considered to be performed by the detector or the memory controller, depending on the implementation. For simplicity in description, the below description refers to operations by the detector, but will be understood as being able to be performed by either the detector, or the memory controller, or both, or that the detector can be part of the memory controller. The administrator could alternatively compute the maximum number of victim rows. The computation is based on determining what the maximum number of rows is that could be accessed the threshold number of times in the timeframe. As one simple example, consider a system in which the number of accesses that defines the threshold is 250K, and the timeframe is 64 ms. If each access takes somewhere on the order of 10 ns, then the maximum number of victim rows is approximated by 26 (64 ms/(250K*10 ns)=25.6). The maximum number of victims can be referred to as MVC (maximum victim count). It will be observed that this number of orders of magnitude smaller than the simple case of monitoring each row individually.

In one embodiment, the detector builds an array of entries based on the value of MVC, 406. The array can be a table or log or other structure. In one embodiment, the number of entries is at least MVC+1. The number of entries could be some multiple of MVC. In one embodiment, each entry of the table or log includes a row address accessible by CAM (content addressable memory) and an access count value. It will be understood that CAM allows access based on comparison of addresses. Other information could also be included in the entries.

In one embodiment, the detector initializes the array at the start of the timeframe, 408. The initialization can include a number of different operations. In one embodiment, on the start of a timeframe, the detector initializes each entry of the array to non-valid (e.g., by setting a flag or entering a value in the entry, or keeping a bitmap of valid entries separate from the array). In one embodiment, the detector resets the count value of each entry to zero.

In one embodiment, the detector can monitor each row by activation that identifies the row in the address fields of the Activate command (e.g., using CAM), 410. In one embodiment, the detector sorts the array by order of counter values (e.g., highest to lowest or lowest to highest). The sorting of the array can be accomplished by a sort, linked list, or other mechanism.

For every new activation of a row detected by the detector, 412, the detector can determine if the row is already in the array, 414. If the row is in the array (Yes branch), the detector increments the count for that entry, 416. There can be an additional requirement of having the entry also be valid (thus, increment if the row is in the array, and the entry is valid). There can be many ways of dealing with the situation where a row is not already in the array (No branch of 414). In one embodiment, the detector determines if there are empty entries or invalid entries available in the array, 418.

If there is an available entry in the array (Yes branch), the detector fills the entry with the information associated with the row for which an activation was detected, 420. As needed for the specific implementation, the detector can also mark the entry as valid. The detector then increments the count for the entry, 416.

If there is not an available entry in the array (No branch of 418), the detector can replace the entry with the lowest access count value with the row address of the row for which the activation was detected. 422. In one embodiment, the access count in the entry is specifically not reset or zeroed. Rather, the address information for the entry is replaced for the row that was just activated. It will be understood that certain rows in memory could be repeatedly accessed, but the repeated access could dither back and forth with access to another entry. Thus, by keeping the access count and incrementing it, it is almost certainly higher than the number of accesses for the row, but it will never be lower than the true number of accesses.

Thus, the detector keeps the previous access count value or row count, and increments it, 416. It will be understood that the simplest form of incrementing is by increasing the row count by 1 each time, but other forms of incrementing could be used. After incrementing, 416, the detector determines if the row count is at the maximum count, or whether the row has reached the threshold, 424. In one embodiment, the detector checks to see if the threshold is reach every time it detects a row activation, but other implementations are possible. In particular, for newly added entries, there may be no need to check the count against the threshold.

Regardless of the implementation, when the detector determines if the row is at the threshold, 424, if the row has not reached the threshold (No branch), the detector keeps monitoring, 410. If the row has reach the threshold (Yes branch), the detector indicates the address information of the row to the memory controller for the triggering of a targeted refresh command, 426. In one embodiment, when an entry reaches the threshold, the detector also resets the smallest count value of the entry to the smallest count value of any entry in the array. Again, such an action prevents the array from losing count information for an entry that is being repeatedly accessed, but at least initially is not being accessed as frequently as other rows. The detector can also clear the valid bit of the entry.

It will be understood that the operations described herein tend to "float up" the most frequently access rows. When implemented as described, there should not ever be a circumstance where there is a row whose actual access count is larger than the smallest access count of any entry in the array or list. Additionally, the risk of false alarms is limited due to the fact that the number of rows causing the target refresh cannot exceed the value of MVC.

Figure 5:
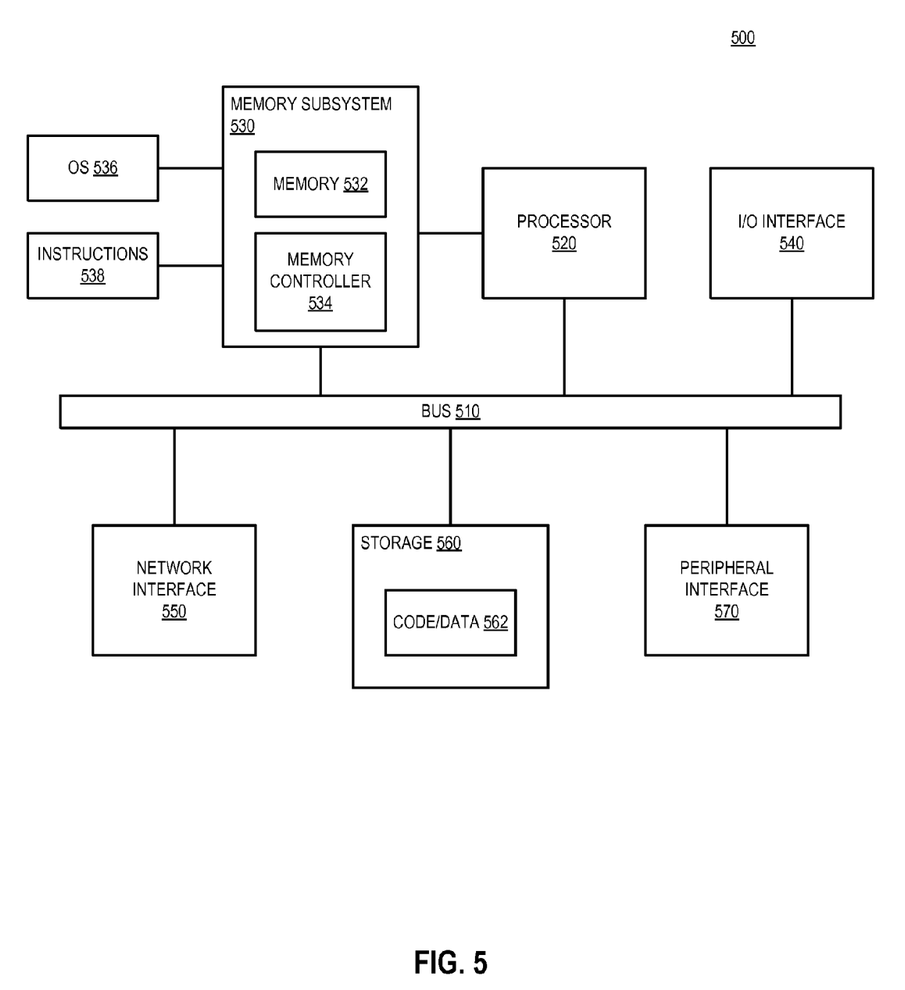
FIG. 5 is a block diagram of an embodiment of a computing system in which row hammer monitoring can be implemented.

FIG. 5 is a block diagram of an embodiment of a computing system in which row hammer monitoring can be implemented. System 500 represents a computing device in accordance with any embodiment described herein, and can be a laptop computer, a desktop computer, a server, a gaming or entertainment control system, a scanner, copier, printer, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 includes memory device 532 where it stores data, instructions, programs, or other items. In one embodiment, memory subsystem includes memory controller 534, which is a memory controller in accordance with any embodiment described herein, and which provides row hammer condition monitoring. In one embodiment, memory controller 534 provides a targeted refresh command to memory device 532 based on the detected row hammer condition. The targeted refresh command causes memory device 532 to perform a targeted refresh, which is a refresh operation off-cycle, meaning it is not on the regularly scheduled cycle of refreshes, and is not necessarily on an area tracked by the memory device as the next area to refresh. Rather, the row or region refreshed is based on a victim row or region identified based on an address associated with the targeted refresh command.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

Figure 6:
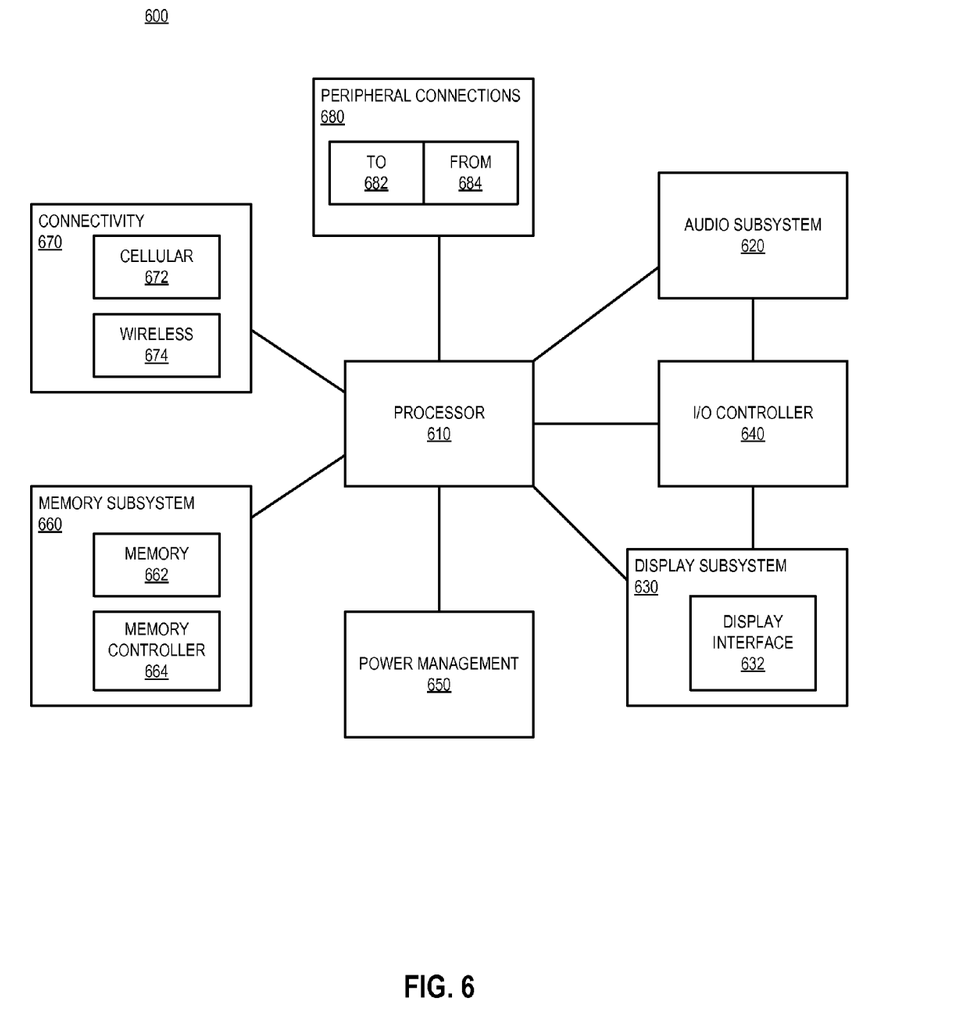
FIG. 6 is a block diagram of an embodiment of a mobile device in which row hammer monitoring can be implemented.

FIG. 6 is a block diagram of an embodiment of a mobile device in which row hammer monitoring can be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. In one embodiment, processor 610 includes optical interface components in addition to a processor die. Thus, the processor die and photonic components are in the same package. Such a processor package can interface optically with an optical connector in accordance with any embodiment described herein.

The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 monitors for a row hammer condition. For example, memory controller 664 can monitor the requests to certain memory addresses, and log how many times a specific address is the subject of a request. The memory controller can track only the highest-accessed addresses by rolling the addresses in and out of a log or table used to track the number of accesses.

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes hardware connectors to couple to a memory device having multiple rows of memory and a memory controller coupled to the hardware connectors. The memory controller is to monitor accesses to rows of a memory device for a time period, determine if a number of accesses for any of the rows exceeds a threshold, and indicate address information for one of the rows when the number of accesses to the row exceeds the threshold in the time period. The threshold is associated with risk of data corruption on a row physically adjacent to the accessed row.

In one embodiment, the memory controller is to couple to a dynamic random access memory (DRAM) device via the connectors. In one embodiment, the memory controller is to monitor accesses for a time period equal to a refresh cycle time for the memory device. In one embodiment, the memory controller is to monitor accesses by keeping a count for only a subset of all rows, and incrementing the count for the selected rows for each access.

In one embodiment, the memory controller is to maintain a table of access counts to monitor the accesses, and is to compare the access counts to the threshold. In one embodiment, the memory controller is to sort the table by order of access count. In one embodiment, the memory controller is to determine a maximum victim count that indicates a maximum number of rows that could reach the threshold in the time period, and wherein a number of entries in the table is based on the maximum victim count. In one embodiment, if there are no empty entries in the table and a row is accessed that is not in the table, the memory controller is to replace the entry with a lowest-value access count with the accessed row, keep the previous access count for the entry, and increment the count for the entry.

In one embodiment, the memory controller is to further trigger a targeted refresh command based on the row that exceeds the threshold, in response to determining the number of accesses to the row exceeds the threshold.

In one aspect, an electronic device comprising includes a memory subsystem and multicore processor coupled to the memory subsystem to access the memory subsystem during execution of the processor. The memory system can include a memory device to store data, the memory device including multiple rows of memory, and a memory controller coupled to the hardware connectors. The memory controller is to monitor accesses to rows of a memory device for a time period, determine if a number of accesses for any of the rows exceeds a threshold, and indicate address information for one of the rows when the number of accesses to the row exceeds the threshold in the time period. The threshold associated with risk of data corruption on a row physically adjacent to the accessed row.

In one embodiment, the memory controller is to couple to a dynamic random access memory (DRAM) device via the connectors. In one embodiment, the memory controller is to monitor accesses for a time period equal to a refresh cycle time for the memory device. In one embodiment, the memory controller is to monitor accesses by keeping a count for only a subset of all rows, and incrementing the count for the selected rows for each access.

In one embodiment, the memory controller is to maintain a table of access counts to monitor the accesses, and is to compare the access counts to the threshold. In one embodiment, the memory controller is to sort the table by order of access count. In one embodiment, the memory controller is to determine a maximum victim count that indicates a maximum number of rows that could reach the threshold in the time period, and wherein a number of entries in the table is based on the maximum victim count. In one embodiment, if there are no empty entries in the table and a row is accessed that is not in the table, the memory controller is to replace the entry with a lowest-value access count with the accessed row, keep the previous access count for the entry, and increment the count for the entry.

In one embodiment, the memory controller is to further trigger a targeted refresh command based on the row that exceeds the threshold, in response to determining the number of accesses to the row exceeds the threshold.

In one aspect, a method includes monitoring accesses to rows of a memory device for a time period, determining if a number of accesses for any of the rows exceeds a threshold, the threshold associated with risk of data corruption on a row physically adjacent to the accessed row, and indicating address information for one of the rows when the number of accesses to the row exceeds the threshold in the time period.

In one embodiment, the method includes monitoring accesses for a time period equal to a refresh cycle time for the memory device. In one embodiment, the method includes monitoring by keeping a count for only a subset of all rows, and incrementing the count for the selected rows for each access. In one embodiment, the method includes maintaining a table of access counts to monitor the accesses, and comparing the access counts to the threshold. In one embodiment, the method includes sorting the table by order of access count. In one embodiment, the method includes determining a maximum victim count that indicates a maximum number of rows that could reach the threshold in the time period, and wherein a number of entries in the table is based on the maximum victim count. In one embodiment, if there are no empty entries in the table and a row is accessed that is not in the table, the method includes replacing the entry with a lowest-value access count with the accessed row, keeping the previous access count for the entry, and incrementing the count for the entry.

In one embodiment, the method further includes triggering a targeted refresh command based on the row that exceeds the threshold, in response to determining the number of accesses to the row exceeds the threshold.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory subsystem comprising:
hardware connectors to couple to a memory device having multiple rows of memory; a memory controller coupled to the hardware connectors, the memory controller to monitor accesses to rows of a memory device for a time period; determine if a number of accesses for any of the rows exceeds a threshold, the threshold associated with risk of data corruption on a row physically adjacent to the accessed row; and indicate address information for one of the rows when the number of accesses to the row exceeds the threshold in the time period, wherein the memory controller is to maintain a table of access counts to monitor the accesses, and is to compare the access counts to the threshold, wherein the memory controller is to determine a maximum victim count that indicates a maximum number of rows that could reach the threshold in the time period, and wherein a number of entries in the table is based on the maximum victim count, wherein if there are no empty entries in the table and a row is accessed that is not in the table, the memory controller is to replace the entry with a lowest-value access count with the accessed row.

2. The memory subsystem of claim 1, wherein the memory controller is to couple to a dynamic random access memory (DRAM) device via the connectors.

3. The memory subsystem of claim 1, wherein the memory controller is to monitor accesses for a time period equal to a refresh cycle time for the memory device.

4. The memory subsystem of claim 1, wherein the memory controller is to monitor accesses by keeping a count for only a subset of all rows, and incrementing the count for the selected rows for each access.

5. The memory subsystem of claim 1, wherein the memory controller is to sort the table by order of access count.

6. The memory subsystem of claim 1, wherein the memory controller is to further trigger a targeted refresh command based on the row that exceeds the threshold, in response to determining the number of accesses to the row exceeds the threshold.

7. An electronic device comprising:
a memory subsystem having a memory device to store data, the memory device including multiple rows of memory; and a memory controller coupled to the hardware connectors, the memory controller to monitor accesses to rows of a memory device for a time period, determine if a number of accesses for any of the rows exceeds a threshold, the threshold associated with risk of data corruption on a row physically adjacent to the accessed row, and indicate address information for one of the rows when the number of accesses to the row exceeds the threshold in the time period; and
a multicore processor coupled to the memory subsystem to access the memory subsystem during execution of the processor, wherein the memory controller is to maintain a table of access counts to monitor the accesses, and is to compare the access counts to the threshold, wherein the memory controller is to determine a maximum victim count that indicates a maximum number of rows that could reach the threshold in the time period, and wherein a number of entries in the table is based on the maximum victim count, wherein if there are no empty entries in the table and a row is accessed that is not in the table, the memory controller is to replace the entry with a lowest-value access count with the accessed row.

8. The device of claim 7, wherein the memory controller is to monitor accesses for a time period equal to a refresh cycle time for the memory device.

9. The device of claim 7, wherein the memory controller is to monitor accesses by keeping a count for only a subset of all rows, and incrementing the count for the selected rows for each access.

10. The device of claim 7, wherein the memory controller is to further trigger a targeted refresh command based on the row that exceeds the threshold, in response to determining the number of accesses to the row exceeds the threshold.

11. A method comprising:
monitoring accesses to rows of a memory device for a time period; determining if a number of accesses for any of the rows exceeds a threshold, the threshold associated with risk of data corruption on a row physically adjacent to the accessed row; and
indicating address information for one of the rows when the number of accesses to the row exceeds the threshold in the time period, wherein monitoring the accesses further comprises maintaining a table of access counts to monitor the accesses, and comparing the access counts to the threshold, wherein monitoring the accesses further comprises determining a maximum victim count that indicates a maximum number of rows that could reach the threshold in the time period, wherein a number of entries in the table is based on the maximum victim count, wherein if there are no empty entries in the table and a row is accessed that is not in the table, monitoring the access with the table further comprises replacing the entry with a lowest-value access count with the accessed row.

12. The method of claim 11, wherein monitoring the accesses comprises monitoring accesses for a time period equal to a refresh cycle time for the memory device.

13. The method of claim 11, wherein monitoring the accesses further comprises keeping a count for only a subset of all rows, and incrementing the count for the selected rows for each access.

14. The method of claim 11, further comprising triggering a targeted refresh command based on the row that exceeds the threshold, in response to determining the number of accesses to the row exceeds the threshold.

* * * * *